(12) United States Patent (10) Patent No.: US 8,902,691 B2
Narui et al. (45) Date of Patent: Dec. 2, 2014

(54) SEMICONDUCTOR DEVICE HAVING CHARGE PUMP CIRCUIT AND INFORMATION PROCESSING APPARATUS INCLUDING THE SAME

(75) Inventors: Seiji Narui, Tokyo (JP); Hitoshi Tanaka, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 146 days.

(21) Appl. No.: 13/607,146

(22) Filed: Sep. 7, 2012

(65) Prior Publication Data

US 2013/0070553 A1 Mar. 21, 2013

(30) Foreign Application Priority Data

Sep. 21, 2011 (JP) ................... 2011-205531

(51) Int. Cl.
*G11C 5/14* (2006.01)
*G11C 16/30* (2006.01)
(52) U.S. Cl.
CPC ........ *G11C 5/145* (2013.01); *G11C 5/14* (2013.01); *G11C 16/30* (2013.01)
USPC .................. 365/230.06; 365/189.09; 365/226
(58) Field of Classification Search
CPC ................. G11C 5/145; G11C 16/08
USPC ................. 365/230.06, 189.09, 226
See application file for complete search history.

(56) References Cited

U.S. PATENT DOCUMENTS

| | | | | |
|---|---|---|---|---|
| 5,193,198 A | * | 3/1993 | Yokouchi | 327/536 |
| 5,726,944 A | * | 3/1998 | Pelley et al. | 365/226 |
| 5,841,725 A | * | 11/1998 | Kang et al. | 365/226 |
| 5,900,764 A | * | 5/1999 | Imam et al. | 327/343 |
| 6,370,075 B1 | * | 4/2002 | Haeberli et al. | 365/226 |
| 7,312,649 B2 | | 12/2007 | Origasa et al. | |
| 2004/0207458 A1 | | 10/2004 | Origasa et al. | |
| 2010/0309716 A1 | | 12/2010 | Tsukada | |

FOREIGN PATENT DOCUMENTS

JP 2004-319011 11/2004

OTHER PUBLICATIONS

Extended European Search Report dated Jan. 28, 2013, directed to EP Application No. 12 18 4938; 3 pages.

* cited by examiner

*Primary Examiner* — Tan T. Nguyen

(57) ABSTRACT

Disclosed herein is a device that includes a capacitor, a pumping circuit supplying a pumping signal changed between first and second potential to a first electrode of the capacitor, and an output circuit precharging a second electrode of the capacitor to a third potential different from the first and second potentials. The second electrode of the capacitor is thereby changed from the third potential to a fourth potential higher than the third potential when the pumping signal is changed from the first potential to the second potential.

19 Claims, 7 Drawing Sheets

SEMICONDUCTOR DEVICE HAVING CHARGE PUMP CIRCUIT AND INFORMATION PROCESSING APPARATUS INCLUDING THE SAME

BACKGROUND OF THE INVENTION

1. Field of the Invention

The present invention relates to a semiconductor device and an information processing apparatus including the same, and more particularly relates to a semiconductor device that generates an internal power potential stepped up by a charge pump operation and an information processing apparatus including the same.

2. Description of Related Art

In most semiconductor devices, an internal voltage is used which is different from an external voltage supplied from the outside. In this case, an internal-voltage generation circuit that generates the internal voltage different from the external voltage is provided in the semiconductor device. For example, when an internal voltage to be generated is higher than an external voltage, the internal-voltage generation circuit steps up the external voltage to generate the internal voltage.

In recent years, an effort to lower the external voltage has been made in order to reduce current consumption. Meanwhile, because some circuit blocks in the semiconductor device require a high internal voltage that is difficult to be lowered, a step-up level by the internal-voltage generation circuit is likely to increase. To obtain the high internal voltage, it is necessary to step up the external voltage three or more times by using a plurality of pumping circuits. This causes a problem that a circuit dimension of the internal-voltage generation circuit is increased.

Japanese Patent Application Laid-Open No. 2004-319011 discloses a semiconductor device in which a dedicated external power-supply terminal is provided in a step-up power-supply circuit. A dedicated external voltage VDD3 is supplied to the external power-supply terminal, which is different from external voltages VDDM and VDDL that are supplied to a memory circuit and a logic circuit.

In the semiconductor device described in Japanese Patent Application Laid-Open No. 2004-319011, because a charge pump operation is performed by using the dedicated external voltage VDD3, efficient step-up can be performed. However, in the disclosure of Japanese Patent Application Laid-Open No. 2004-319011, both an amplitude of a clock signal supplied to one of electrodes of a capacitor and a voltage for pre-charging the other electrode of the capacitor are the same as the dedicated external voltage VDD3, and accordingly a level of a generated step-up voltage VPP is theoretically two times the external voltage VDD3. Therefore, when the external voltage VDD3 has a level close to the level of the step-up voltage VPP, the step-up level becomes too high, so that not only it is hard to perform a stable charge pump operation but also it causes a problem of increasing the current consumption.

SUMMARY

In one embodiment, there is provided a semiconductor device that includes: a first capacitor including first and second electrodes; a pumping circuit supplying a pumping signal to the first electrode of the first capacitor, the pumping signal being changed between a first potential and a second potential different from the first potential; and an output circuit precharging the second electrode of the first capacitor to a third potential different from the first and second potentials so that the second electrode of the first capacitor is changed from the third potential to a fourth potential higher than the third potential when the pumping signal is changed from the first potential to the second potential.

In another embodiment, there is provided a semiconductor device that includes: first, second and third external terminals supplied with first, second and third voltages from an outside of the semiconductor device, respectively, the first, second and third voltages being different from each other; a capacitor including first and second electrodes; a pumping circuit electrically coupled to the first and second terminals, the pumping circuit supplying either one of the first and second voltages to the first electrode of the capacitor in response to an oscillator signal; and an output circuit electrically coupled to the third terminal, the output circuit supplying the third voltage to the second electrode of the capacitor.

In still another embodiment, there is provided an information processing apparatus that includes: a power supply unit supplying at least second and third potentials different from each other, the second and third potentials being different from a first potential; and a semiconductor device including first, second and third external power supply terminals supplied with the first, second and third potentials, respectively, a first capacitor having first and second electrodes, a pumping circuit that alternately supplies the first and second potentials to the first electrode of the first capacitor, and an output circuit that precharges the second electrode of the first capacitor to the third potential.

DETAILED DESCRIPTION OF THE EMBODIMENTS

Figure 1:
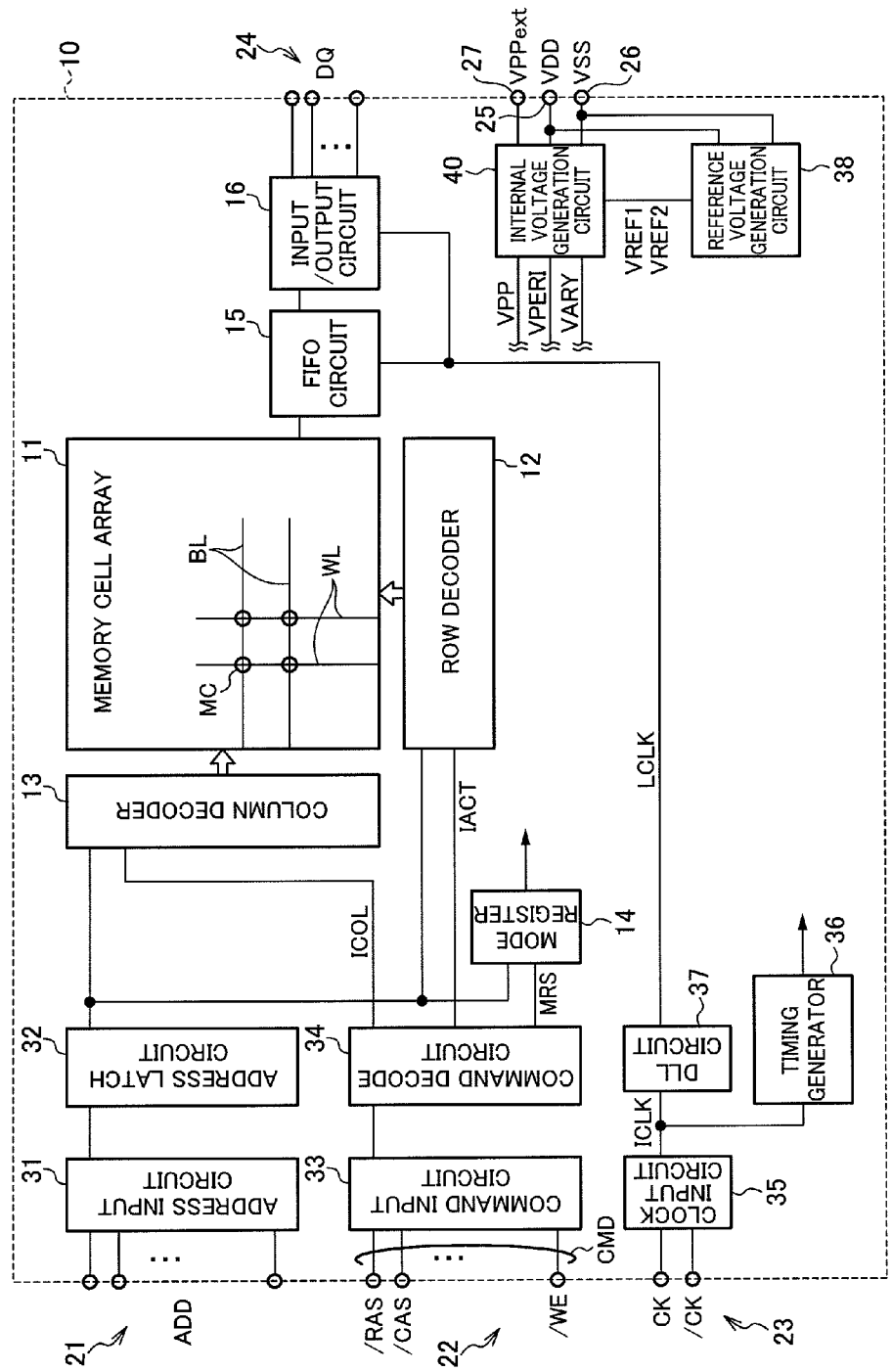
FIG. 1 is a block diagram showing an overall configuration of a semiconductor device according to an embodiment of the present invention.

Referring now to FIG. 1, the semiconductor device 10 according to an embodiment of the present invention is a DRAM (Dynamic Random Access Memory) integrated in a single semiconductor chip. The semiconductor device 10 includes a memory cell array 11. The memory cell array 11 includes a plurality of word lines WL, a plurality of bit lines BL, and a plurality of memory cells MC arranged at their intersections. The selection of the word line WL is performed by a row decoder 12 and the selection of the bit line BL is performed by a column decoder 13.

As shown in FIG. 1, the semiconductor device 10 employs a plurality of external terminals that include address terminals 21, command terminals 22, clock terminals 23, data terminals 24, and external power supply terminals 25-27.

The address terminals 21 are supplied with an address signal ADD from outside. The address signal ADD supplied to the address terminals 21 is transferred via an address input circuit 31 to an address latch circuit 32 that latches the address signal ADD. The address signal ADD latched in the address latch circuit 32 is supplied to the row decoder 12, the column decoder 13, or a mode register 14. The mode register 14 is a circuit in which parameters indicating an operation mode of the semiconductor device 10 are set.

The command terminals 22 are supplied with a command signal CMD from outside. The command signal CMD is constituted by a plurality of signals such as a row-address strobe signal /RAS, a column-address strobe signal /CAS, and a write enable signal /WE. The slash "/" attached to the head of a signal name indicates an inverted signal of a corresponding signal or indicates that the corresponding signal is a low-active signal. The command signal CMD supplied to the command terminal 22 is transferred via a command input circuit 33 to a command decode circuit 34. The command decode circuit 34 decodes the command signal CMD to generate various internal commands that include an active signal IACT, a column signal ICOL, and a mode register set signal MRS.

The active signal IACT is activated when the command signal CMD indicates a row access (an active command). When the active signal IACT is activated, the address signal ADD latched in the address latch circuit 32 is supplied to the row decoder 12. The word line WL designated by this address signal ADD is selected accordingly.

The column signal ICOL is activated when the command signal CMD indicates a column access (a read command or a write command). When the column signal ICOL is activated, the address signal ADD latched in the address latch circuit 32 is supplied to the column decoder 13. In this manner, the bit line BL designated by this address signal ADD is selected accordingly.

Accordingly, when the active command and the read command are issued in this order and a row address and a column address are supplied in synchronism with these commands, read data is read from a memory cell MC designated by these row address and column address. Read data DQ is output to outside from the data terminals 24 via an FIFO circuit 15 and an input/output circuit 16. Meanwhile, when the active command and the write command are issued in this order, a row address and a column address are supplied in synchronism with these commands, and then write data DQ is supplied to the data terminals 24, the write data DQ is supplied via the input/output circuit 16 and the FIFO circuit 15 to the memory cell array 11 and written in the memory cell MC designated by these row address and column address. The FIFO circuit 15 and the input/output circuit 16 are operated in synchronism with an internal clock signal LCLK. The internal clock signal LCLK is generated by a DLL circuit 37.

The mode register set signal MRS is activated when the command signal CMD indicates a mode register set command. Accordingly, when the mode register set command is issued and a mode signal is supplied from the address terminals 21 in synchronism with this command, a set value of the mode register 14 can be overwritten.

A pair of clock terminals 23 is supplied with external clock signals CK and /CK from outside, respectively. These external clock signals CK and /CK are complementary to each other and then transferred to a clock input circuit 35. The clock input circuit 35 generates an internal clock signal ICLK based on the external clock signals CK and /CK. The internal clock signal ICLK is a basic clock signal within the semiconductor device 10. The internal clock signal ICLK is supplied to a timing generator 36 and thus various internal clock signals are generated. The various internal clock signals generated by the timing generator 36 are supplied to circuit blocks such as the address latch circuit 32 and the command decode circuit 34 and define operation timings of these circuit blocks.

The internal clock signal ICLK is also supplied to the DLL circuit 37. The DLL circuit 37 generates the internal clock signal LCLK based on the internal clock signal ICLK. The internal clock signal LCLK is a clock signal that is phase-controlled. As explained above, the internal clock signal LCLK is supplied to the FIFO circuit 15 and the input/output circuit 16. In this manner, the read data DQ is output in synchronism with the internal clock signal LCLK.

The external power supply terminals 25 to 27 are supplied with power supply potentials VDD, VSS, and VPPext, respectively. Although not particularly limited thereto, the power supply potential VDD is 1.0 V, the power supply potential VSS is 0 V, and the power supply potential VPPext is 2.5 V. These power supply potentials VDD, VSS, and VPPext are supplied to an internal voltage generation circuit 40. The power supply potentials VDD and VSS are also supplied to a reference voltage generation circuit 38. The reference voltage generation circuit 38 generates reference voltages VREF1 and VREF2, and supplies the generated reference voltages VREF1 and VREF2 to the internal voltage generation circuit 40.

The internal voltage generation circuit 4C generates various internal potentials including internal potentials VPP, VPERI, and VARY based on the power supply potentials VDD, VSS, and VPPext. The internal potential VPP is mainly used in the row decoder 12, and is slightly higher than the power supply potential VPPext supplied from the outside. The row decoder 12 drives the word line WL selected based on the address signal ADD to the internal potential VPP, which brings cell transistors included in the corresponding memory cells MC into ON state. The internal potential VARY is used in a sense amplifier (not shown). When the sense amplifier is activated, one of paired bit lines is driven to the internal potential VARY and the other line is driven to the power supply potential VSS. The data are read from the memory cells MC and amplified accordingly. The internal potential VPERI is used as an operation potential of most peripheral circuits such as the address latch circuit 32 and the command decoding circuit 34. Low power consumption of the semiconductor device 10 is achieved by using the internal potential VPERI, which is lower than the power supply potential VDD, as the operation potential of the peripheral circuits.

Figure 2:
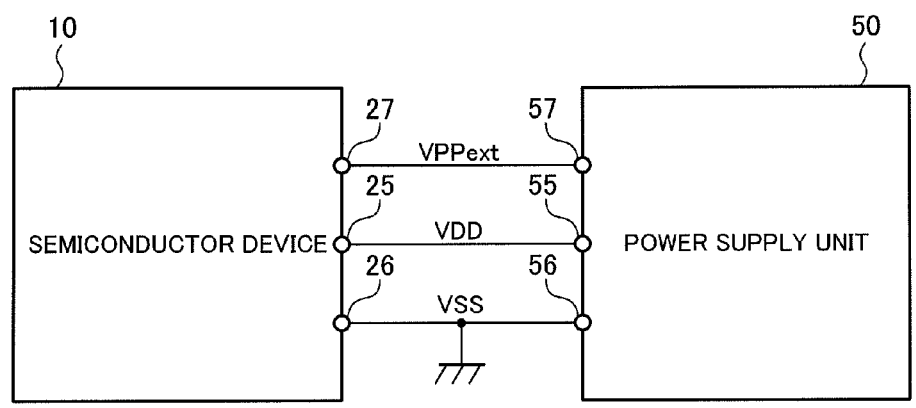
FIG. 2 is a block diagram of an information processing apparatus including the semiconductor device shown in FIG. 1.

Turning to FIG. 2, the information processing apparatus according to an embodiment includes the semiconductor device 10 shown in FIG. 1 and a power supply unit 50 connected to the semiconductor device 10. The power supply unit 50 includes external power supply terminals 55 to 57, and supplies the power supply potentials VDD, VSS, and VPPext to the semiconductor device 10 through the external power supply terminals 55 to 57, respectively. Therefore, the external power supply terminals 55 to 57 of the power supply unit 50 are connected to the external power supply terminals 25 to 27 of the semiconductor device 10, respectively. Because the power supply potential VSS is a ground potential, the power supply potential VSS is technically not supplied from the power supply unit 50 to the semiconductor device 10. However, in the present embodiment, it is considered that the power supply potential VSS is also supplied from the power supply unit 50 by regarding power supply lines as being included in the power supply unit 50.

Supply capabilities of the power supply potentials VDD and VPPext are limited by a capability of the power supply unit 50. Although not particularly limited thereto, the supply capability of the power supply potential VDD is designed to have a sufficiently large value, while the supply capability of the power supply potential VPPext is designed to have a relatively small value. The reason thereof is because the power supply potential VDD is required to have a sufficient supply capability because it is used for many applications, while the power supply potential VPPext is only used for a specific application. For example, the supply capability of the power supply potential VPPext is designed to 1/10 or less of that of the power supply potential VDD.

Figure 3:
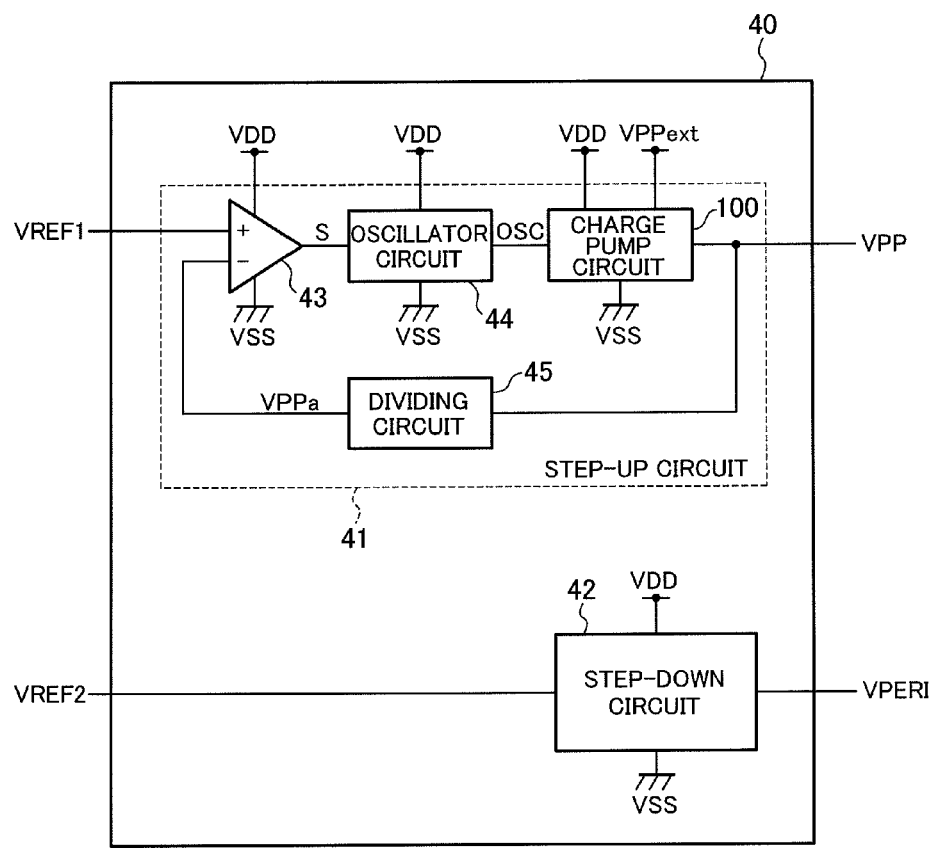
FIG. 3 is a block diagram showing a configuration of the internal-voltage generation circuit shown in FIG. 1.

Turning to FIG. 3, the internal voltage generation circuit 40 includes a step-up circuit 41 and a step-down circuit 42. The step-up circuit 41 generates the internal potential VPP by referring to the reference voltage VREF1. The step-down circuit 42 generates the internal potential VPERI by referring to the reference voltage VREF2. Although the internal voltage generation circuit 40 further includes a circuit block that generates the internal potential VARY and the like, it is omitted from the drawing of FIG. 3. The power supply potentials VDD, VSS, and VPPext are supplied to circuit blocks included in the step-up circuit 41, and the power supply potentials VDD and VSS are supplied to circuit blocks included in the step-down circuit 42.

The step-up circuit 41 includes a comparator 43, an oscillator circuit 44, a charge pump circuit 100, and a dividing circuit 45. The comparator 43 compares a level of an internal voltage VPPa supplied via the dividing circuit 45 with a level of the reference voltage VREF1. The level of the reference voltage VREF1 is equal to the level of the internal voltage VPPa output from the dividing circuit 45 when the internal potential VPP has a designed value. Therefore, when the internal potential VPP is lower than the designed value, a detection signal S, which is an output of the comparator 43, has a high level, and when the internal potential VPP is higher than the designed value, the detection signal S output from the comparator 43 has a low level. The detection signal S is supplied to the oscillator circuit 44.

The oscillator circuit 44 is activated when the detection signal S is at a high level. When the oscillator circuit 44 is activated, an oscillator signal OSC having a predetermined frequency is output from the oscillator circuit 44. Because the power supply potentials VDD and VSS are supplied to the oscillator circuit 44 as operation powers, an amplitude of the oscillator signal OSC is from the power supply potential VSS to the power supply potential VDD. The oscillator signal OSC is supplied to the charge pump circuit 100. The charge pump circuit 100 is a circuit block that performs a charge pump operation based on the oscillator signal OSC, thereby generating the internal potential VPP.

Figure 4:
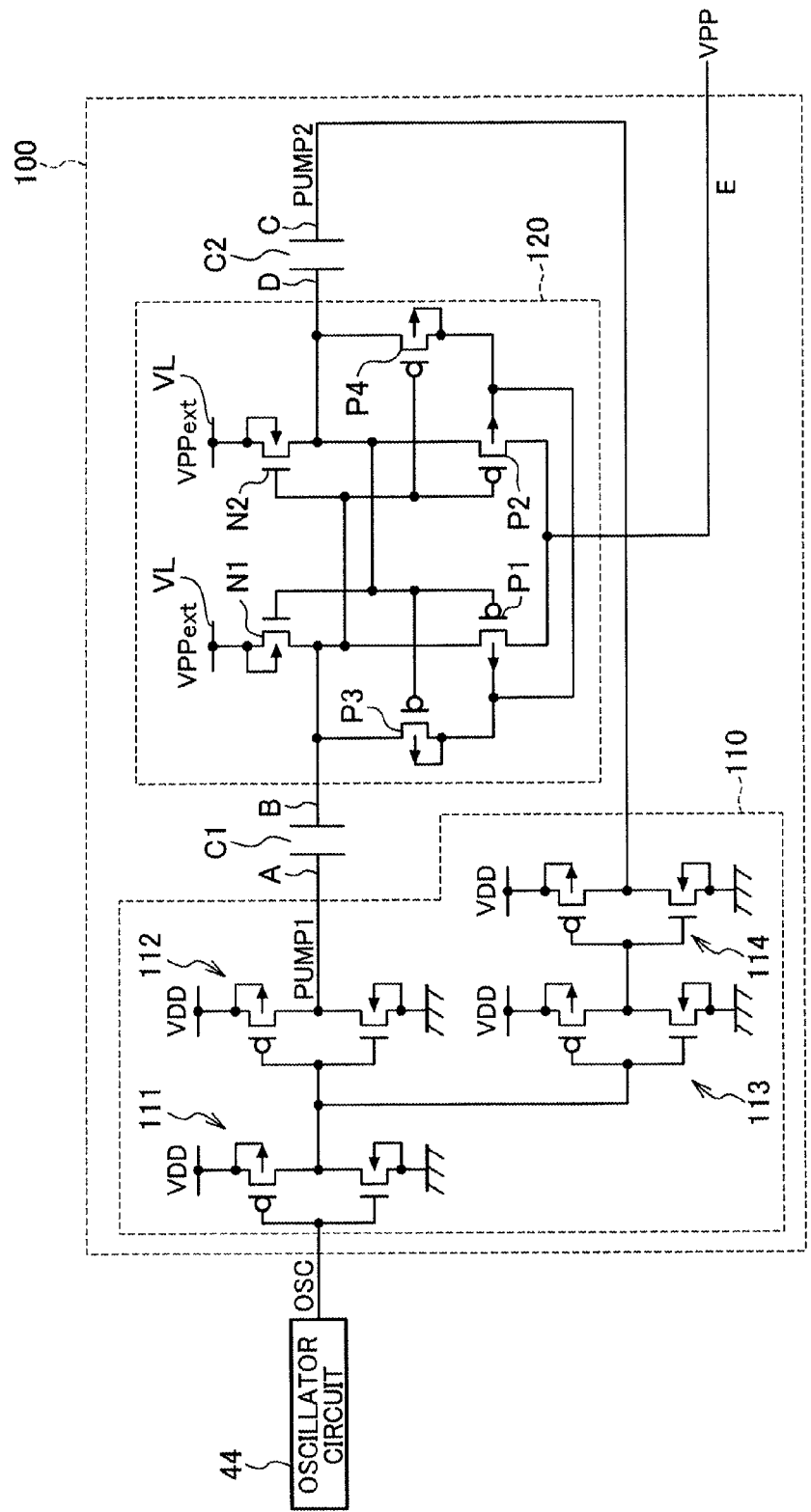
FIG. 4 is a circuit diagram of the charge pump circuit shown in FIG. 3 according to a first embodiment of the present invention.

Turning to FIG. 4, the charge pump circuit 100 includes two capacitors C1 and C2, a pumping circuit 110 that pumps the capacitors C1 and C2 based on the oscillator signal OSC, and an output circuit 120 that outputs the internal potential VPP from the pumped capacitors C1 and C2.

The pumping circuit 110 includes a plurality of inverter circuits 111 to 114. The oscillator signal OSC is supplied to the inverter circuit 111 at the first stage. The oscillator signal OSC is then supplied to a node A, which is one of electrodes of the capacitor C1, via the inverter circuits 111 and 112. The oscillator signal OSC is also supplied to a node C, which is one of electrodes of the capacitor C2, via the inverter circuits 111, 113, and 114. Therefore, a pumping signal PUMP1 having the same phase as the oscillator signal OSC is supplied to the node A, while a pumping signal PUMP2 having an opposite phase to the oscillator signal OSC is supplied to the node C. Because the inverter circuits 111 to 114 use the power supply potentials VDD and VSS as operation powers, the pumping signals PUMP1 and PUMP2 have an amplitude from the power supply potential VSS to the power supply potential VDD.

As described above, because the phase of the pumping signal PUMP1 supplied to the node A and the phase of the pumping signal PUMP2 supplied to the node C are opposite to each other, the node C becomes VSS level in a period in which the node A becomes VDD level, and the node C becomes VDD level in a period in which the node A becomes VSS level.

The output circuit 120 is connected to nodes B and D, which are the other electrodes of the capacitors 01 and C2, respectively. As shown in FIG. 4, an operation power of the output circuit 120 is the power supply potential VPPext. More specifically, the output circuit 120 includes an N-channel MOS transistor N1 and a P-channel MOS transistor P1 connected in series in this order between a voltage supply line VL to which the power supply potential VPPext is supplied and an output node E, and an N-channel MOS transistor N2 and a P-channel MOS transistor P2 connected in series in this order between the voltage supply line VL and the output node E in the same manner. The output node E is a node for outputting the internal potential VPP.

A connection point of the transistors N1 and P1 is connected to the node B that is the other electrode of the capacitor C1, and gate electrodes of the transistors N1 and P1 are connected in common to the node D that is the other electrode of the capacitor C2. Similarly, a connection point of the transistors N2 and P2 is connected to the node D that is the other electrode of the capacitor C2, and gate electrodes of the transistors N2 and P2 are connected in common to the node B that is the other electrode of the capacitor C1.

The output circuit 120 further includes P-channel MOS transistors P3 and P4 for supplying base potentials to the transistors P1 and P2. The transistor P3 is connected between the node B and bases of the transistors P1 and P2, and a gate electrode of the transistor P3 is connected to the node D. Similarly, the transistor P4 is connected between the node D and bases of the transistors P1 and P2, and a gate electrode of the transistor P4 is connected to the node B.

The circuit configuration of the charge pump circuit 100 is as explained above. Although device structures of the capacitors C1 and C2 are not particularly limited, it is preferred in a DRAM to constitute the capacitors C1 and C2 by connecting in series a plurality of capacitor elements having the same structure as a cell capacitor of a memory cell MC.

Figure 5:
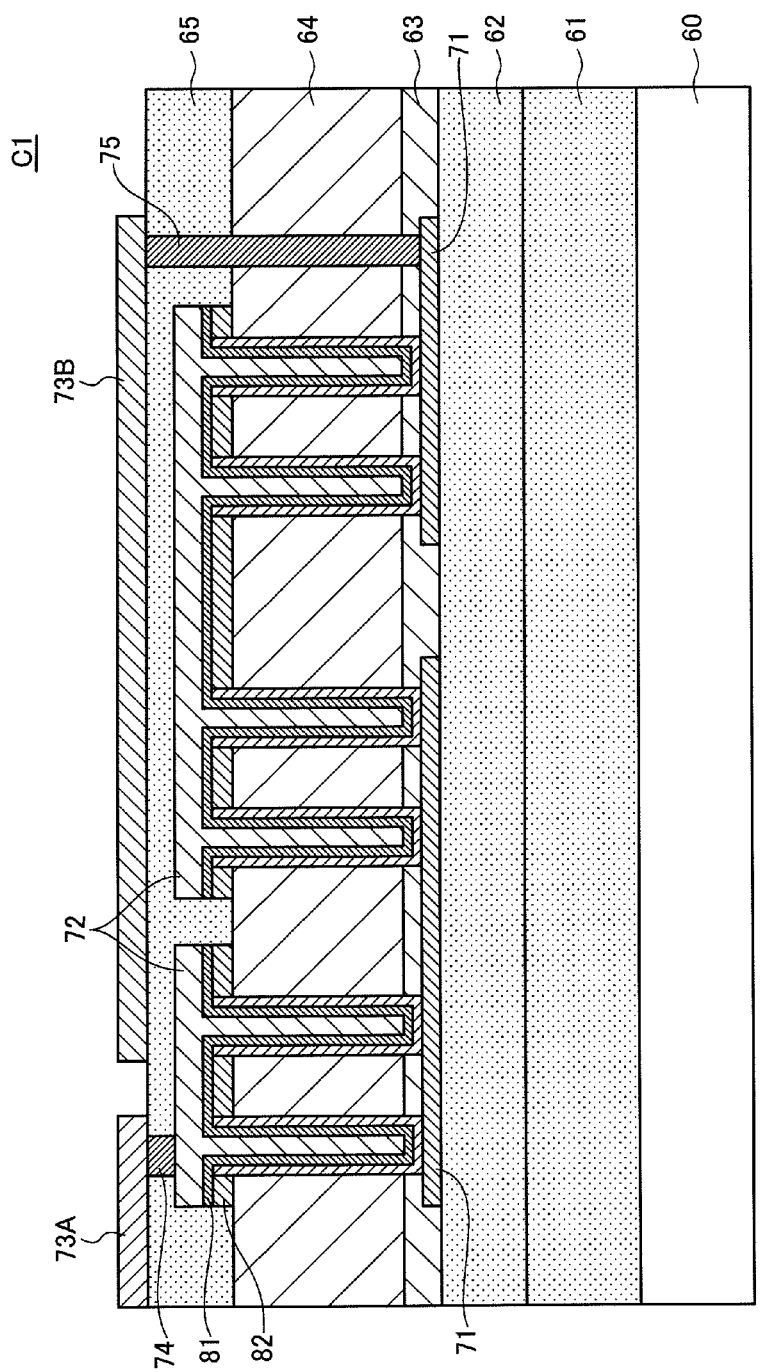
FIG. 5 is a cross-sectional view showing an example of the capacitor shown in FIG. 4.

In the example shown in FIG. 5, interlayer dielectric films 61, 62, 64, and 65 and a stopper film 63 are formed on a surface of a semiconductor substrate 60. A capacitance is obtained between a power supply line 71 formed on a surface of the inter-layer dielectric film 62 and a power supply line 72 formed on a surface of the inter-layer dielectric film 64 with a support film 82 interposed therebetween. The power supply line 71 is formed to cover an inner wall of a through hole formed in the interlayer dielectric film 64, and the power supply line 72 is formed to cover an inner wall of the power supply line 71 via a capacitance dielectric film 81. The power supply line 72 is connected to a power supply line 73A via a through hole electrode 74, and the power supply line 71 is connected to a power supply line 73B via a through hole electrode 75. The power supply line 73A corresponds to the node A that is one of the electrodes of the capacitor C1, and the power supply line 73B corresponds to the node B that is the other electrode of the capacitor C1.

In this way, the capacitor C1 is formed by connecting in series three capacitor elements having the same structure as the cell capacitor of the memory cell MC. The same device structure can be adopted for the capacitor C2. The reason why the plurality of capacitor elements are connected in series in this example is because a withstand voltage of the cell capacitor of the memory cell MC is equal to or lower than VPP, and a higher withstand voltage is achieved by connecting the plurality of capacitor elements in series.

An operation of the charge pump circuit 100 will be explained in detail with reference to FIG. 6.

Figure 6:
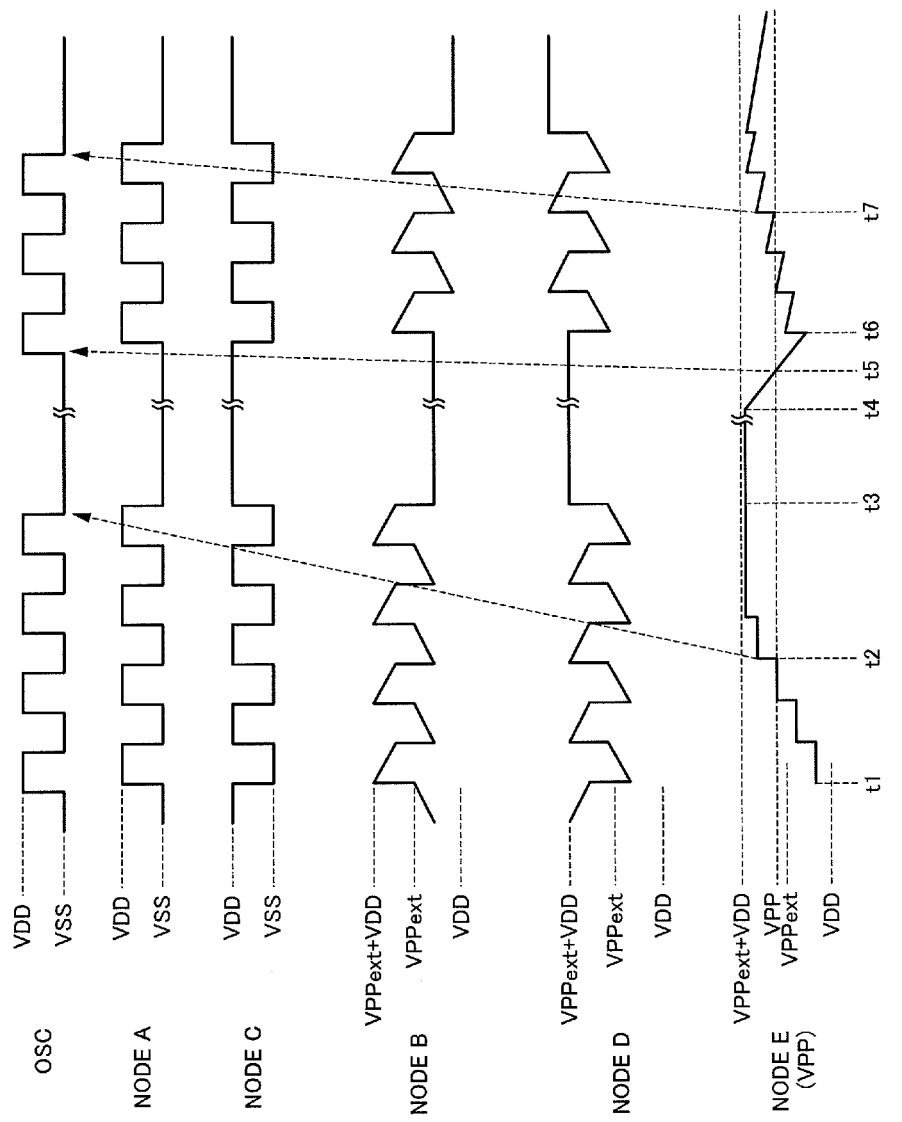
FIG. 6 is a timing diagram for explaining an operation of the charge pump circuit shown in FIG. 4.

A period from a time t1 to a time t2 shown in FIG. 6 indicates a state of the semiconductor device 10 at the time of initialization. At the time of initialization, a potential of the node E is lower than the designed value of the internal potential VPP, and accordingly the oscillator circuit 44 activates the oscillator signal OSC. When the oscillator signal OSC is activated, the pumping signals PUMP1 and PUMP2 are alternately changed to a level of VDD, by which a charge pump operation using the capacitors C1 and C2 is achieved.

Specifically, when the pumping signal PUMP1 is the level of VSS and the pumping signal PUMP2 is the level of VDD, a potential of the node D is higher than a potential of the node B, and therefore the transistors N1 and N2, which are switching elements, are switched on and off, respectively, and the transistors P1 and P2, which are also switching elements, are switched off and on, respectively. In this period, the node B is precharged to a level of VPPext. When the pumping signal PUMP1 is changed to the level of VDD and the pumping signal PUMP2 is changed to the level of VSS, the potential of the node B becomes higher than the potential of the node D, and therefore the transistors N1 and N2 are switched off and on, respectively, and the transistors P1 and P2 are switched on and off, respectively. With this operation, the node B, which is precharged to the level of VPPext, is pumped by the capacitor C1 and ideally stepped up to a level of "VPPext+VDD". At this time, because the transistor P1 is switched on, the stepped-up potential is output via the node E. In This period, the node D is precharged to the level of VPPext.

When the pumping signal PUMP1 is changed to the level of VSS and the pumping signal PUMP2 is changed to the level of VDD, the potential of the node D becomes higher than the potential of the node B, and therefore the transistors N1 and N2 are switched on and off, respectively, and the transistors P1 and P2 are switched off and on, respectively. With this operation, the node D, which is precharged to the level of VPPext, is pumped by the capacitor C2 and ideally stepped up to the level of "VPPext+VDD". At this time, because the transistor P2 is switched on, the stepped-up potential is output via the node E. In this period, the node B is precharged to the level of VPPext.

By repeating the above operations, the potential of the node E is gradually increased. In the example shown in FIG. 6, the potential of the node E reaches the designed value of the internal potential VPP at the time t2. When the potential of the node E reaches the designed value of the internal potential VPP, the detection signal S output from the comparator 43 is changed to a low level. This causes the oscillator circuit 44 to stop the output of the oscillator signal OSC. However, there is a certain time lag from a time when the potential of the node E reaches the designed value of the internal potential VPP to a time when the output of the oscillator signal OSC is stopped. In the example shown in FIG. 6, the oscillator signal OSC is stopped at a time t3.

When the oscillator signal OSC is stopped, the level of the internal potential VPP is decreased due to an operation of a circuit that uses the internal potential VPP (mainly a word driver included in the row decoder 12). In the example shown in FIG. 6, the row decoder 12 starts an operation at a time t4, and accordingly the Level of the node E is started to decrease. When the potential of the node E falls below the designed value of the internal potential VPP at a time t5, the detection signal S output from the comparator 43 is changed to a high level again. This causes the oscillator circuit 44 to resume the output of the oscillator signal OSC. As a result, the potential of the node E is started to increase from a time t6. In the example shown in FIG. 6, the potential of the node E reaches the designed value of the internal potential VPP at a time t7, and the output of the oscillator signal OSC is stopped in response thereto. By repeating the above operations, the potential of the node E is stabilized near the designed value of the internal potential VPP.

In the present embodiment, the precharge level of the capacitors C1 and C2 is VPPext, which is pumped with an amplitude from VSS to VDD. Therefore, an ideal stepped-up level is "VPPext+VDD". As described above, the level of the internal potential VPP is slightly higher than the power supply potential VPPext supplied from the outside. Therefore, by setting the stepped-up level to "VPPext+VDD", no excessive step-up is performed, and the step-up operation can be performed with high efficiency.

That is, when the pumping signals PUMP1 and PUMP2 have an amplitude from VSS to VPPext and when the precharge level is VPPext, the stepped-up level becomes "2×VPPext", which is adversely much higher than the target level of the internal potential VPP. As described above, because there is a certain time lag in stopping the pumping operation, not only a stable charge pump operation can be hardly performed but also the current consumption is increased when the stepped-up level is much higher than the target value. On the other hand, in the present embodiment, because the stepped-up level is suppressed to "VPPext+VDD", which is closer to the target level of the internal potential VPP, there are no such problems.

In addition, only the output circuit 120 consumes the power supply potential VPPext supplied from the outside among the circuit blocks constituting the charge pump circuit 100, and the pumping circuit 110 does not consume the power supply potential VPPext. Therefore, even when the supply capability of the power supply potential VPPext by the power supply unit 50 is low, the current consumption can be kept low.

Figure 7:
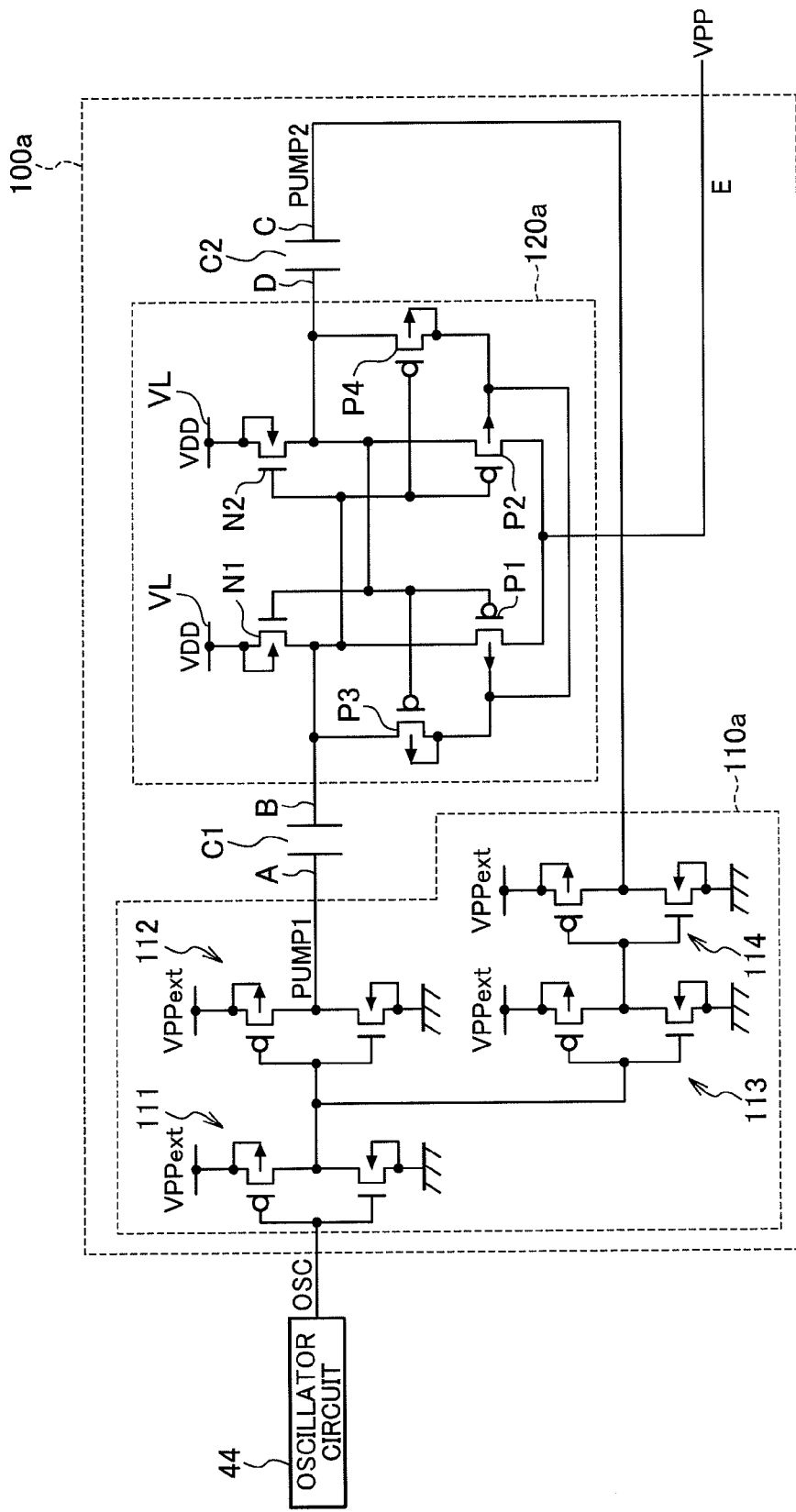
FIG. 7 is a circuit diagram of a charge pump circuit shown in FIG. 3 according to a second embodiment of the present invention.

In the charge pump circuit 100a shown in FIG. 7, contrary to the charge pump circuit 100 shown in FIG. 4, the power supply potential VPPext is used in a pumping circuit 110a, and the power supply potential VDD is used in an output circuit 120a. In this case, the pumping signals PUMP1 and PUMP2 have the amplitude from the power supply potential VPPext to the power supply potential VSS, and the precharge level of the nodes B and D is VDD. Therefore, the stepped-up level becomes "VPPext+VDD", and the same effect as the first embodiment can be achieved. In the second embodiment, consumption of the power supply potential VPPext is slightly larger compared to the first embodiment because the power supply potential VPPext is used in the pumping circuit 110a. However, because the precharge level of the nodes B and D is suppressed to VDD, the withstand voltage of the capacitors C1 and C2 can be designed to even lower. This means that the number of capacitor elements connected in series as described with reference to FIG. 5 can be reduced and thus the occupation area of the capacitors C1 and C2 on the substrate can be reduced.

It is apparent that the present invention is not limited to the above embodiments, but may be modified and changed without departing from the scope and spirit of the invention.

What is claimed is:

1. A semiconductor device comprising:
   first, second and third external terminals supplied with first, second and third voltages from an outside of the semiconductor device, respectively, the first, second and third voltages being different from each other;
   a capacitor including first and second electrodes;
   a pumping circuit electrically coupled to the first and second terminals, the pumping circuit supplying either one of the first and second voltages to the first electrode of the capacitor in response to an oscillator signal; and
   an output circuit electrically coupled to the third terminal, the output circuit supplying the third voltage to the second electrode of the capacitor.

2. The semiconductor device as claimed in claim 1, wherein the third voltage is greater than each of the first and second voltages.

3. The semiconductor device as claimed in claim 2, wherein the pumping circuit supplies the first voltage to the first electrode of the capacitor when the oscillator signal is a first potential, the pumping circuit supplying the second voltage to the first electrode of the capacitor when the oscillator signal is a second potential, and a voltage of the second electrode of the capacitor changing from the third voltage to a fourth voltage greater than the third voltage when the oscillator signal changes from the first potential to the second potential so that the output circuit outputting the fourth voltage through the second electrode of the capacitor.

4. The semiconductor device as claimed in claim 3, wherein the first voltage is a ground voltage.

5. The semiconductor device as claimed in claim 4, further comprising:
   a plurality of memory cells;
   a plurality of word lines coupled to the memory cells, respectively; and
   a row decoder activating a selected one of the word lines based on an address signal; wherein the fourth voltage is supplied to the row decoder.

6. The semiconductor device as claimed in claim 1, wherein the second voltage is greater than each of the first and third voltages.

7. A semiconductor device comprising:
   a first external power supply terminal supplied with a first potential from outside of the device;
   a second external power supply terminal supplied with a second potential from outside of the device, the second potential being higher than the first potential;
   a third external power supply terminal supplied with a third potential from outside of the device, the third potential being higher than the second potential;
   an internal circuit configured to perform a circuit operation by use of the first and second potentials; and
   a step-up power-supply circuit configured to generate an internal voltage that is higher than the second potential and to be used by the internal circuit, the step-up power-supply circuit comprising:
      a first capacitor including first and second electrodes;
      a pumping circuit supplying a pumping signal to the first electrode of the first capacitor, the pumping signal being changed between the first potential and one of the second and third potentials; and
      an output circuit supplying the second electrode of the first capacitor with the other of the second and third potentials when the pumping signal takes the first potential so that the second electrode of the first capacitor is changed, when the pumping signal is changed from the first potential to the one of the second and third potentials, from the other of the second and third potentials to a fourth potential that is higher than the third potential.

8. The semiconductor device as claimed in claim 7, wherein the step-up power-supply circuit further comprises a second capacitor including third and fourth electrodes, and an output node;
   wherein the pumping circuit supplies an inverted signal of the pumping signal to the third electrode of the second capacitor;
   wherein the output circuit supplies the fourth electrode of the second capacitor with the other of the second and third potentials when the inverted signal takes the first potential so that the fourth electrode of the second capacitor is changed, when the inverted signal is changed from the first potential to the one of the second and third potentials, from the other of the second and third potentials to the fourth potential; and
   wherein the output node is electrically connected to the second electrode of the first capacitor to output the fourth potential when the pumping signal takes the one of the second and third potentials, and to the fourth electrode of the second capacitor to output the fourth potential when the pumping signal takes the first potential.

9. The semiconductor device as claimed in claim 8, wherein the output node is electrically disconnected from the second electrode of the first capacitor when the pumping signal takes the first potential, and from the fourth electrode of the second capacitor when the pumping signal takes the one of the second and third potentials.

10. The semiconductor device as claimed in claim 9, characterized in that the second potential serves as the one of the second and third potentials and the third potential serves as the other of the second and third potentials.

11. The semiconductor device as claimed in claim 9, characterized in that the third potential serves as the one of the second and third potentials and the second potential serves as the other of the second and third potentials.

12. The semiconductor device as claimed in claim 9, wherein the output circuit includes:
    a first transistor electrically connected between a voltage supply line and the second electrode of the first capacitor, the voltage line being supplied with the other of the second and third potentials;
    a second transistor electrically connected between the second electrode of the first capacitor and the output node;
    a third transistor electrically connected between the voltage supply line and the fourth electrode of the second capacitor; and
    a fourth transistor electrically connected between the fourth electrode of the second capacitor and the output node,
    wherein the second electrode of the first capacitor is electrically connected in common to control electrodes of the third and fourth transistors, and
    wherein the fourth electrode of the second capacitor is electrically connected in common to control electrodes of the first and second transistors.

13. The semiconductor device as claimed in claim 12, wherein the output circuit further includes:
    a fifth transistor electrically connected between the second electrode of the first capacitor and a base of the second transistor; and
    a sixth transistor electrically connected between the fourth electrode of the second capacitor and a base of the fourth transistor.

14. The semiconductor device as claimed in claim 13, wherein the second electrode of the first capacitor is electrically connected to a control electrode of the sixth transistor, and the fourth electrode of the second capacitor is electrically connected to a control electrode of the fifth transistor.

15. The semiconductor device as claimed in claim 14, wherein each of the first and third transistors is of a first conductivity type, and each of the second, fourth, fifth and sixth transistors is of a second conductivity type opposite to the first conductivity type.

16. The semiconductor device as claimed in claim 8, wherein the first capacitor comprises a plurality of first unit capacitors connected in series between the first and second electrodes and the second capacitor comprises a plurality of second unit capacitors connected in series between the third and fourth electrodes.

17. The semiconductor device as claimed in claim 16, wherein in that the internal circuit comprises a memory cell array including a plurality of word lines, a plurality of bit lines and a plurality of memory cells each connected to associated ones of the word and bit lines, a row decoder selecting at least one of the word lines, and a column decoder selecting at least one of the bit lines;
wherein the internal voltage generated by the step-up power-supply circuit is used to drive the at least one of the word lines selected by the row decoder; and
wherein each of the memory cells includes a cell capacitor that is substantially the same in structure as each of the first and second unit capacitors.

18. The semiconductor device as claimed in claim 7, wherein the device cooperates with a power supply unit to constitute an information processing apparatus, and the power supply unit supplies the first, second and third potentials to the first, second and third external power supply terminals of the device, respectively.

19. The semiconductor device as claimed in claim 7, wherein the internal circuit comprises a memory cell array including a plurality of word lines, a plurality of bit lines and a plurality of memory cells each connected to associated ones of the word and bit lines, a row decoder selecting at least one of the word lines, and a column decoder selecting at least one of the bit lines, and the internal voltage generated by the step-up power-supply circuit is used to drive the at least one of the word lines selected by the row decoder.

* * * * *